United States Patent [19]

Watanabe

[11] Patent Number: 4,998,025

[45] Date of Patent: Mar. 5, 1991

[54] DEVICE FOR GENERATING STROBE PULSES WITH A DESIRED TIMING

[75] Inventor: Naoyoshi Watanabe, Gyoda, Japan

[73] Assignee: Advantest Corporation, Tokyo, Japan

[21] Appl. No.: 354,775

[22] Filed: May 22, 1989

[30] Foreign Application Priority Data

May 23, 1988 [JP] Japan ................................ 63-126597

[51] Int. Cl.[5] ....................... H03K 5/13; H03K 19/096
[52] U.S. Cl. .................................... 307/269; 307/480;
328/55; 328/63; 371/27
[58] Field of Search ............................ 323/63, 72, 55;
307/269, 480; 371/27, 20; 324/73 A; 364/569,
571.07, 571.08, 579, 580

[56] References Cited

U.S. PATENT DOCUMENTS

| 4,578,705 | 3/1986 | Elmis et al. | 307/269 |
| 4,789,835 | 12/1988 | Herlein | 307/269 |
| 4,837,521 | 6/1989 | Herlein et al. | 307/269 |
| 4,849,702 | 7/1989 | West et al. | 307/269 |
| 4,864,160 | 4/1989 | Abdoo | 307/269 |

Primary Examiner—Timothy P. Callahan
Attorney, Agent, or Firm—Staas & Halsey

[57] ABSTRACT

A timing generator for generating arbitrarily delayed pulses, in which, upon each readout of period data from a period data memory, a computing section subtracts its accumulated value from delay data read out of a delay data memory, and upon inversion of the sign of the subtracted value, the immediately preceding subtracted value is provided to a delayed pulse generator, which generates a pulse at the timing corresponding to the subtracted value applied thereto.

5 Claims, 6 Drawing Sheets

FIG. 1 PRIOR ART
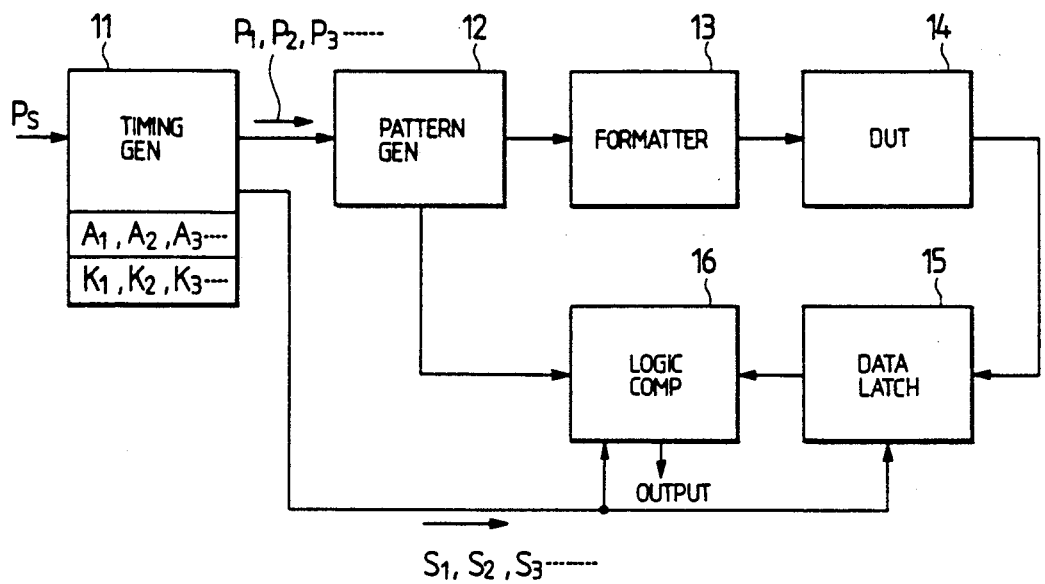
PRIOR ART
FIG. 2A
FIG. 2B
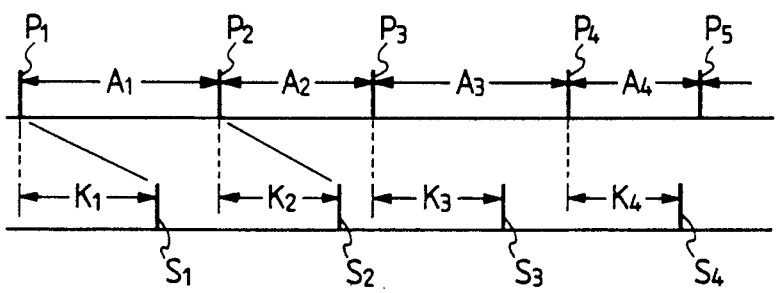
PRIOR ART
FIG. 3A
FIG. 3B
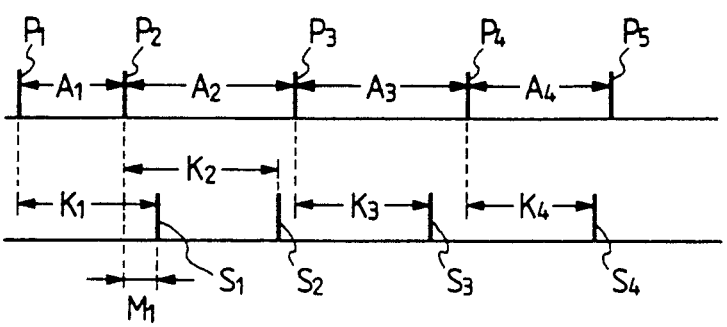

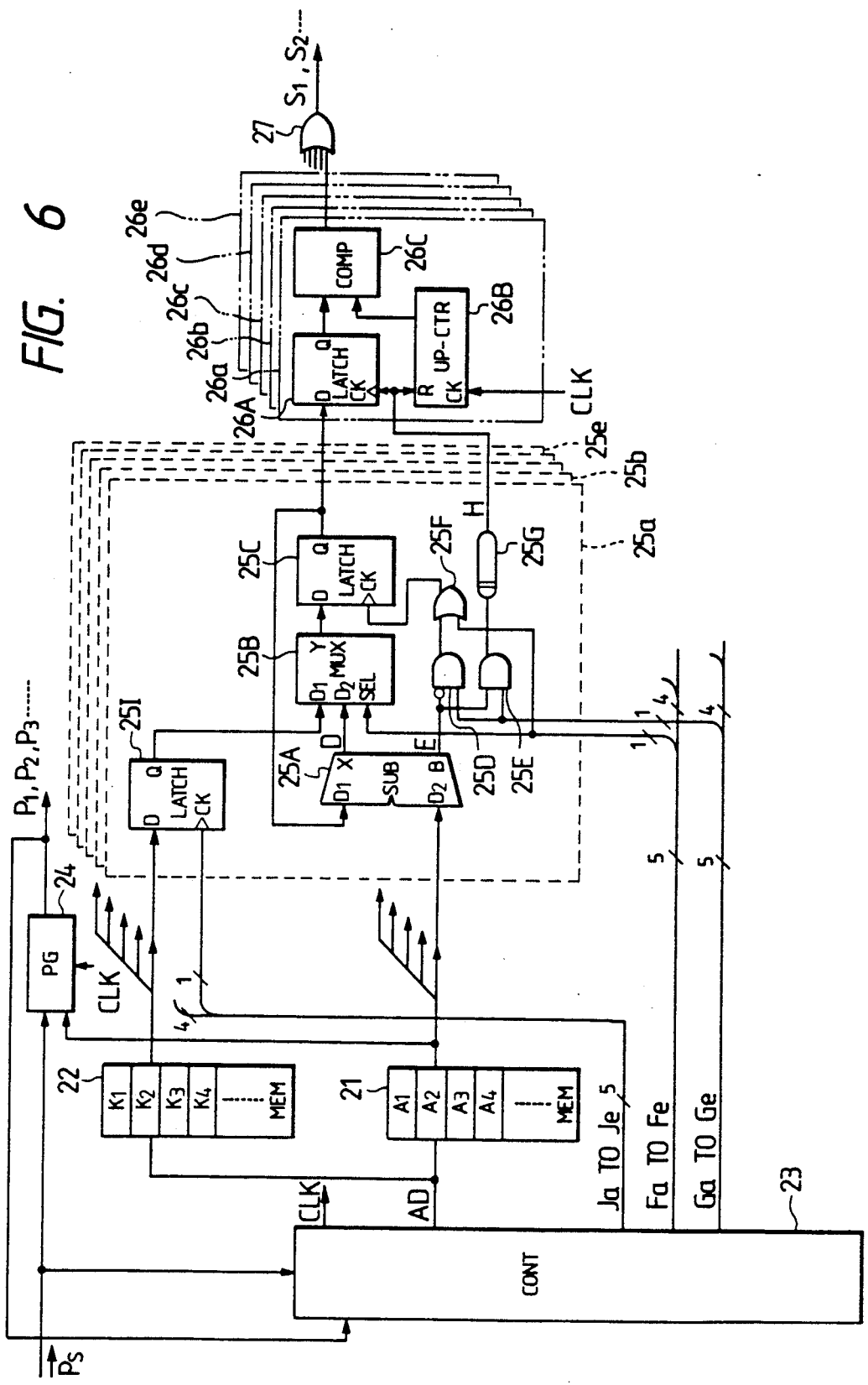

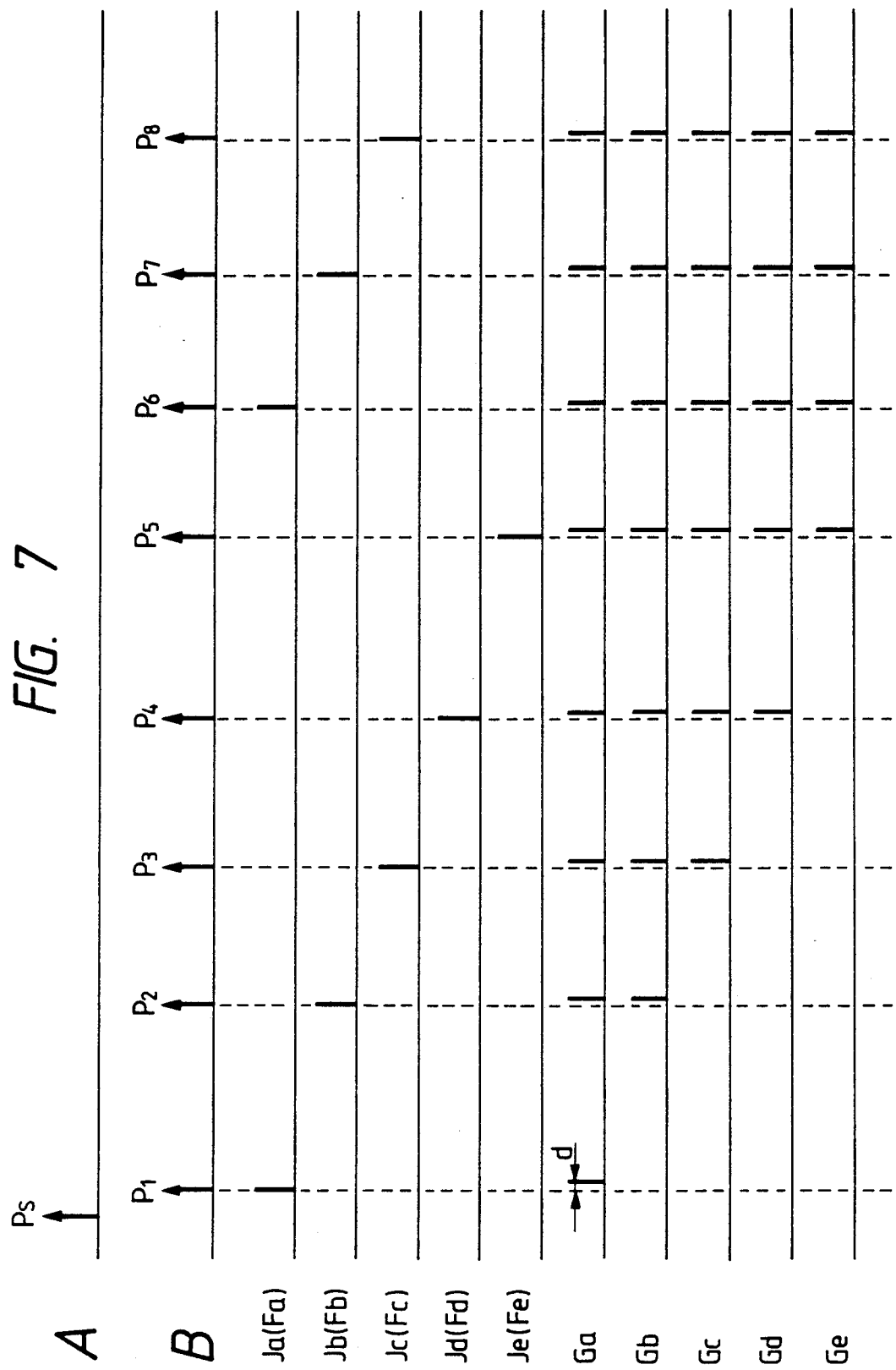

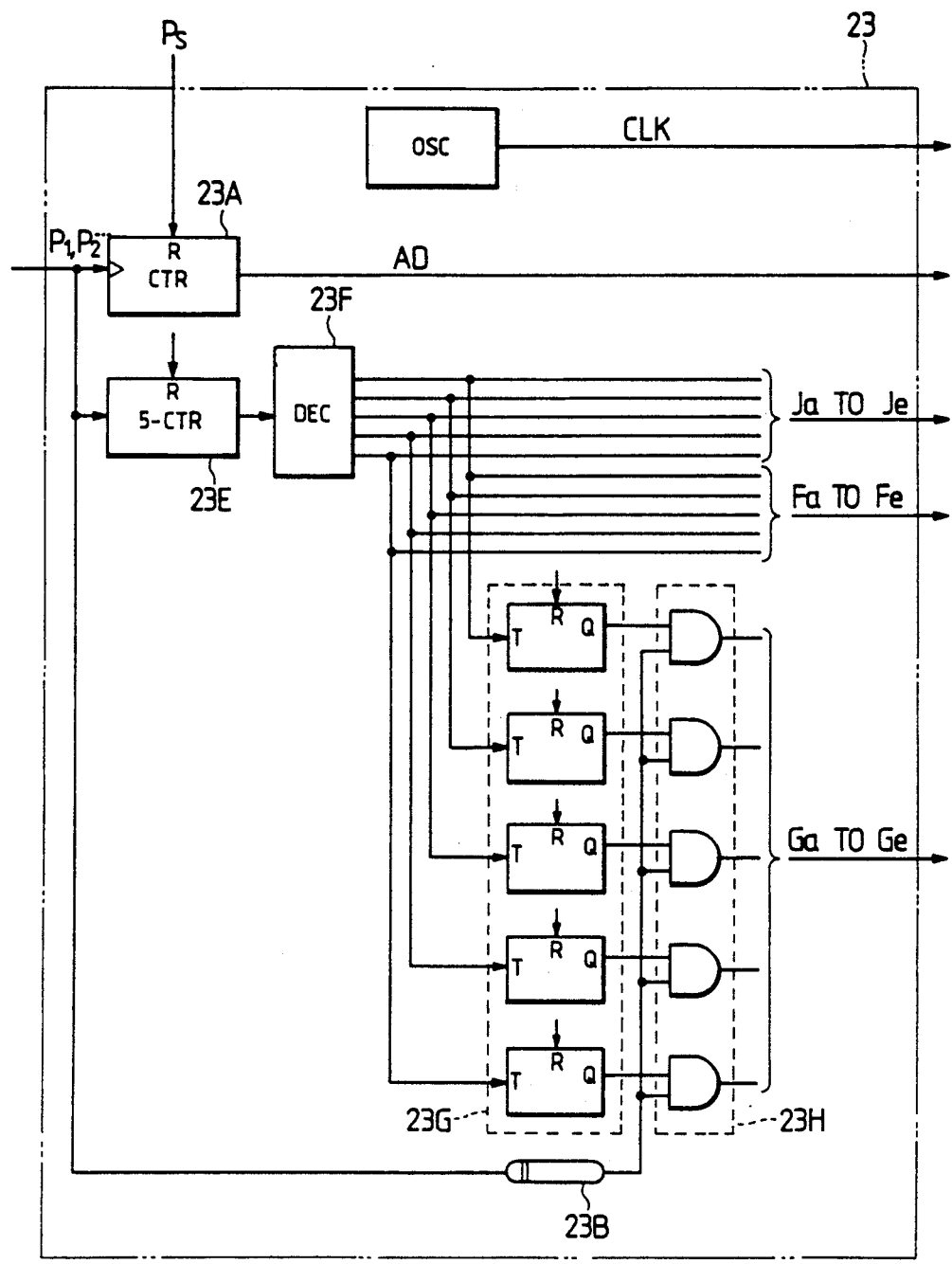

DEVICE FOR GENERATING STROBE PULSES WITH A DESIRED TIMING

BACKGROUND OF THE INVENTION

The present invention relates to a timing generator which is capable of generating arbitrarily delayed pulses which can be used in an IC tester, for example.

The IC tester comprises, as shown in FIG. 1, a timing generator 11, a pattern generator 12 which generates test pattern signals in response to timing signals $P_1$, $P_2$, $P_3$, ... from the timing generator 11, a formatter 13 which converts the test pattern signals from the test pattern generator 12 into a real waveform for input into a device under test (hereinafter referred to simply as DUT) 14, a data latch circuit 15 which latches a response output signal from the DUT 14, and a logic comparator 16 which compares the response output signal latched in the data latch circuit 15 and an expected value pattern from the pattern generator 12 to determine whether the DUT 14 is good or not.

In the timing generator 11 there are present period data $A_1$, $A_2$, $A_3$, ... for defining the time intervals at which the test pattern signals are generated and delay data $K_1$, $K_2$, $K_3$, ... which correspond to the period data $A_1$, $A_2$, $A_3$, ..., respectively. When supplied with a start pulse Ps from the outside, the timing generator 11 outputs the timing signals $P_{1k}$, $P_2$, $P_3$, ... at the time intervals defined by the period data $A_1$, $A_2$, $A_3$, ..., and the pattern generator 12 yields the test pattern signals in response to the timing signals $P_1$, $P_2$, $P_3$, ...

The delay data $K_1$, $K_2$, $K_3$, ... are timed to the generation of response output signals which are provided from the DUT 14 supplied with test patterns in accordance with the timing signals $P_1$, $P_2$, $P_3$, ... At the timing set by the timing generator 11 in dependence on the delay data $K_1$, $K_2$, $K_3$, .. strobe pulses $S_1$, $S_2$, $S_3$, ... are generated and applied to the latch circuit 15.

The timing for generating the strobe pulses $S_1$, $S_2$, $S_3$, ... is usually set so that they are delayed behind the generation of the timing pulses $P_1$, $P_2$, $P_3$, ... for periods $K_1$, $K_2$, $K_3$, ..., respectively, which are shorter than the corresponding periods of the time intervals $A_1$, $A_2$, $A_3$, ... at which the test patterns are produced, as shown in FIGS. 2A and 2B. However, there are times, for example, as depicted in FIGS. 3A and 3B, when the strobe pulse $S_1$ is to be generated in the next period as a result of setting the period data $A_1$ to a shorter period of time. In such an instance, it is customary in the prior art to employ a method in which a flag "NEXT" is set for the delay data $K_1$, a calculation $K_1 - A_1 = M_1$ is performed to obtain delay data, and the strobe pulse $S_1$ is generated the time $M_1$ behind the beginning of the next period.

According to the prior art in the case of generating each of the strobe pulses $S_1$, $S_2$, $S_3$, ... at the timing beyond the limits of the corresponding period, the flag "NEXT" is set and the delay time $M_1$ is defined relative to the beginning of the next period, and consequently, the allowable delay time is limited only to the range of the next period. It is therefore impossible, with the prior art, to test a device which outputs a response signal after as much delay is several cycles of the timing pulse, such as a central processor.

SUMMARY OF THE INVENTION

It is therefore an object of the present invention to provide a timing generator which permits the generation of strobe pulses to be delayed for a desired number of cycles of the timing signal.

The timing generator of the present invention includes: a period data memory which stores period data for defining the time intervals at which test pattern signals are generated; a delay data memory which stores delay data for defining delay times on the basis of the timing for generating the test pattern signals; a computing means which, upon each readout of the period data from the period data memory, subtracts its accumulated value from the delay data; and a delayed pulse generating means which, upon inversion of the sign of the computed value by the calculating means, reads thereinto, as delay data, the result of the immediately preceding computation and generates a pulse which is delayed by the value of this delay data relative to the beginning of the next pattern generating cycle.

According to the present invention, the period data is cumulatively subtracted from the delay data, and upon detecting the inversion of the sign of the computed value, the cycle of the timing signal in which to produce a delayed pulse is defined. In the cycle thus defined by the result of computation in the immediately preceding cycle is utilized as delay data so that a pulse is produced which is delayed by the value of the delay data relative to the beginning of the next pattern generation cycle. Accordingly, even if the delay data is set to a value containing a plurality of pattern generating cycles, delayed pulses can be produced at preset timing. Consequently, strobe pulses can be generated for testing a device which yields a response signal several cycles after the beginning of the pattern generating cycle.

BRIEF DESCRIPTION OF THE DRAWINGS

FIG. 1 is a block diagram showing the general arrangement of a conventional IC tester;

FIGS. 2A and 2B are timing charts showing the relationship between timing pulses and strobe pulses delayed for a time shorter than one cycle thereof;

FIGS. 3A and 3B are timing charts showing the relationship between timing pulses and strobe pulse delayed for a time longer than one cycle thereof;

FIG. 6 is a block diagram illustrating a second embodiment of the present invention;

FIG. 7 is a timing chart for explaining various control signals in the embodiment depicted in FIG. 6; and FIG. 8 is a block diagram illustrating an example of a controller 23 used in the embodiment shown in FIG. 6.

DESCRIPTION OF THE PREFERRED EMBODIMENTS

Figure 4:
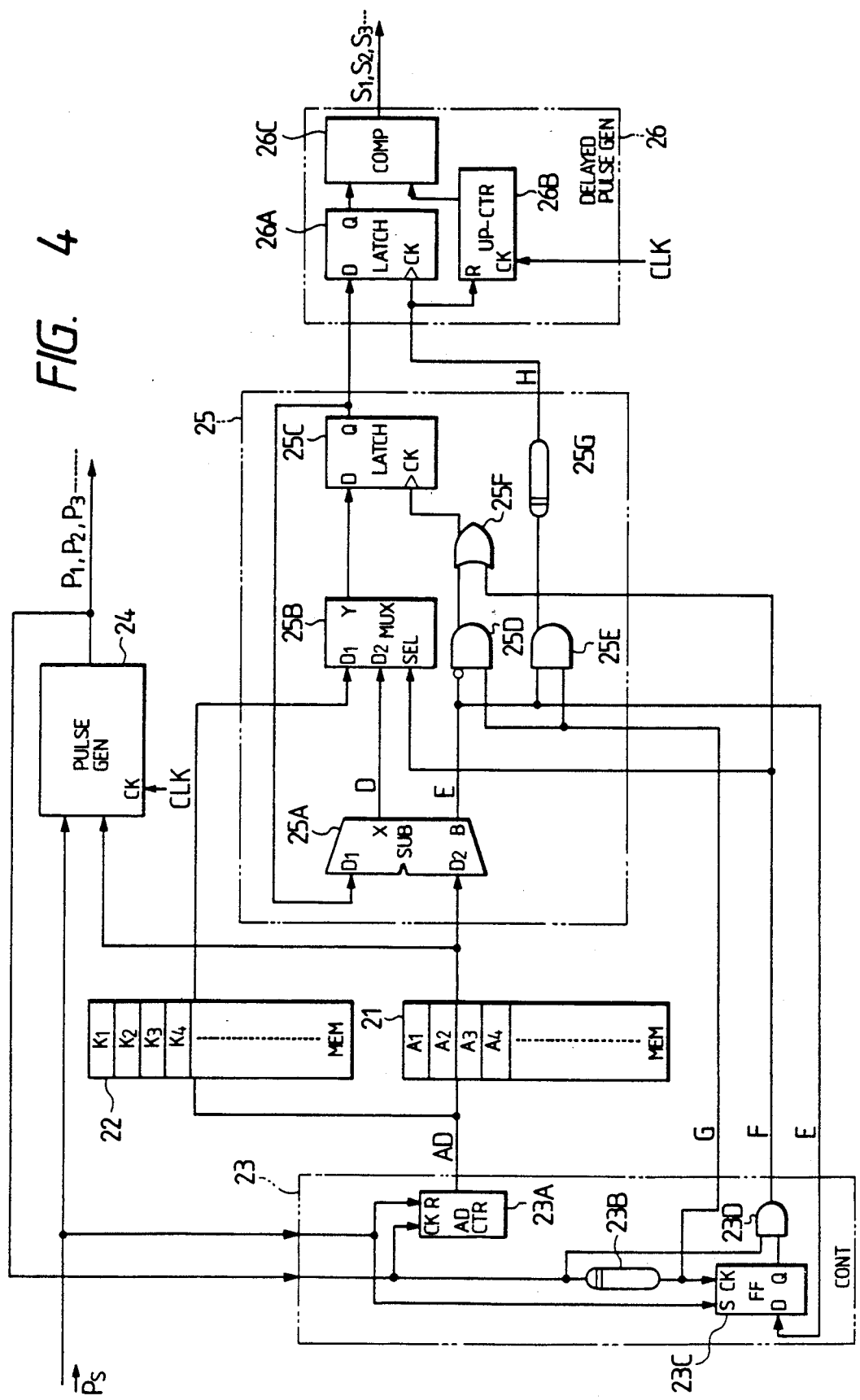
FIG. 4 is a block diagram illustrating an embodiment of the timing generator of the present invention.

FIG. 4 illustrates in block form an embodiment of the timing generator of the present invention. This embodiment includes: a period data memory 21 in which there are prestored period data $A_1$, $A_2$, $A_3$, ... for test pattern signals which are provided to a DUT; a delay data memory 22 in which there are prestored delay data $K_1$, $K_2$, $K_3$, ... corresponding to the period data; a pulse generator 24 which generates timing pulses $P_1$, $P_2$, $P_3$, ... for determining the timing for the application of test patterns to the DUT on the basis of the period data read out of the memory 21; a computing section 25 which pulses $S_1$, $S_2$, $S_3$, ... on the basis of the period data $A_1$, $A_2, A_3, \ldots$ and the delay data $K_1, K_2, K_3, \ldots$ read out of the memories 21 and 22, respectively; and a controller 23 which generates read addresses for the memories 21 and 22 and control signals for the calculator 25; and a delayed pulse generator 26 which outputs the strobe pulses $S_1, S_2, S_3, \ldots$ delayed in accordance with delay data computed by the computing section 25.

The controller 23 includes an address counter 23A which counts the timing pulses $P_1, P_2, P_3, \ldots$ provided from the pulse generator 24 and applies the count value as a readout address to each of the memories 21 and 22, a delay element 23B which delays each of the timing pulses $P_1, P_2, P_3, \ldots$ for a fixed time and outputs it as a control signal G, a D-type flip-flop 23C and a gate 23D for generating a control signal F corresponding to the timing pulse to be delayed, and an oscillator (not shown) for generating clock pulses CLK of a fixed period.

The computing section 25 includes a subtractor 25A which subtracts the period data $A_1, A_2, A_3, \ldots$ input to its one input $D_2$, from a value input to the other input $D_1$, and provides the difference value and its sign (indicated by "H" when it is minus) to output terminals X and B, respectively, a multiplexer 25B which selectively outputs either one of the delay data $K_1, K_2, K_3, \ldots$ from the memory 22 and the difference value from the subtractor 25A in accordance with the control signal F from the controller 23, a latch circuit 25C which holds the output of the multiplexer 25B and applies it to the input $D_1$ of the subtractor 25A and the delayed pulse generator 26, and a gate 25E and a delay element 25G for providing the control signal F or G from the controller 23, as a latch signal H, to the delayed pulse generator 26.

The delayed pulse generator 26 responds to the latch signal H to latch in a latch circuit 26A timing data supplied from the computing section 25, compares the contents of the latch circuit 26A and a counter 26B by a comparator 26C and, upon each detection of coincidence between them, yields the strobe pulses $S_1, S_2, S_3, \ldots$. The counter 26B counts upward high-frequency clock pulses CLK of a fixed period which are always provided from the controller 23 to a clock terminal CK of the counter 26B, and its count value is reset to zero by the latch signal H. The pulse counter 24 may be of the same construction as that of the delayed pulse generator 26 but may also be of an arrangement which employs a down-counter instead of using a comparator, counts clock pulses down when delay data is preset in the down-counter, and generates a pulse when the counter has reached a zero count.

Turning next to the timing chart of FIG. 5, the operation of the timing generator shown in FIG. 4 will be described. At the time point shown in FIG. 5A a start pulse Ps is applied to the controller 23 and the pulse generator 24 to initialize them. The pulse generator 24 responds to the start pulse Ps to generate a first timing pulse $P_1$ shown in FIG. 5B and thereafter, upon each application thereto of the period data $A_1, A_2, A_3, \ldots$ read out of the memory 21, generates the timing pulses $P_2, P_3, \ldots$ in succession at time intervals specified by these data.

On the other hand, the flip-flop 23C is set by the start pulse Ps and its Q output goes high "H" as depicted in FIG. 5Q, enabling the gate 23D and is provided as the control signal F. The timing pulse $P_1$ is also delayed by the delay element 23B and is then applied to a clock terminal CK of the flip-flop 23C, which loads therein a low "L" level of the signal E, causing its Q output to go low "L" and hence disable the gate 23D.

The address counter 23A is stepped one stage after responding to the first timing pulse $P_1$ to provide its contents as a first address, for example, "0000", to each of the memories 21 and 22, from which the period data $A_1$ and the corresponding delay data $K_1$ are read out, respectively. At this time the control signal F is being applied to a selective control terminal SEL of the multiplexer 25B and its output terminal Y is connected to its input $D_1$. Consequently, the delay data $K_1$ read out of the memory 22 is provided via the multiplexer 25B to an input terminal D of the latch circuit 25C, wherein the data $K_1$ is latched by a latch signal provided thereto via a gate 25F. The data $K_1$ thus latched is provided to the one input terminal $D_1$ of the subtractor 25A and a difference $K_1 - A_1$ between it and the period data $A_1$ supplied to the other input terminal $D_2$ is provided to an output terminal X.

Figure 5:
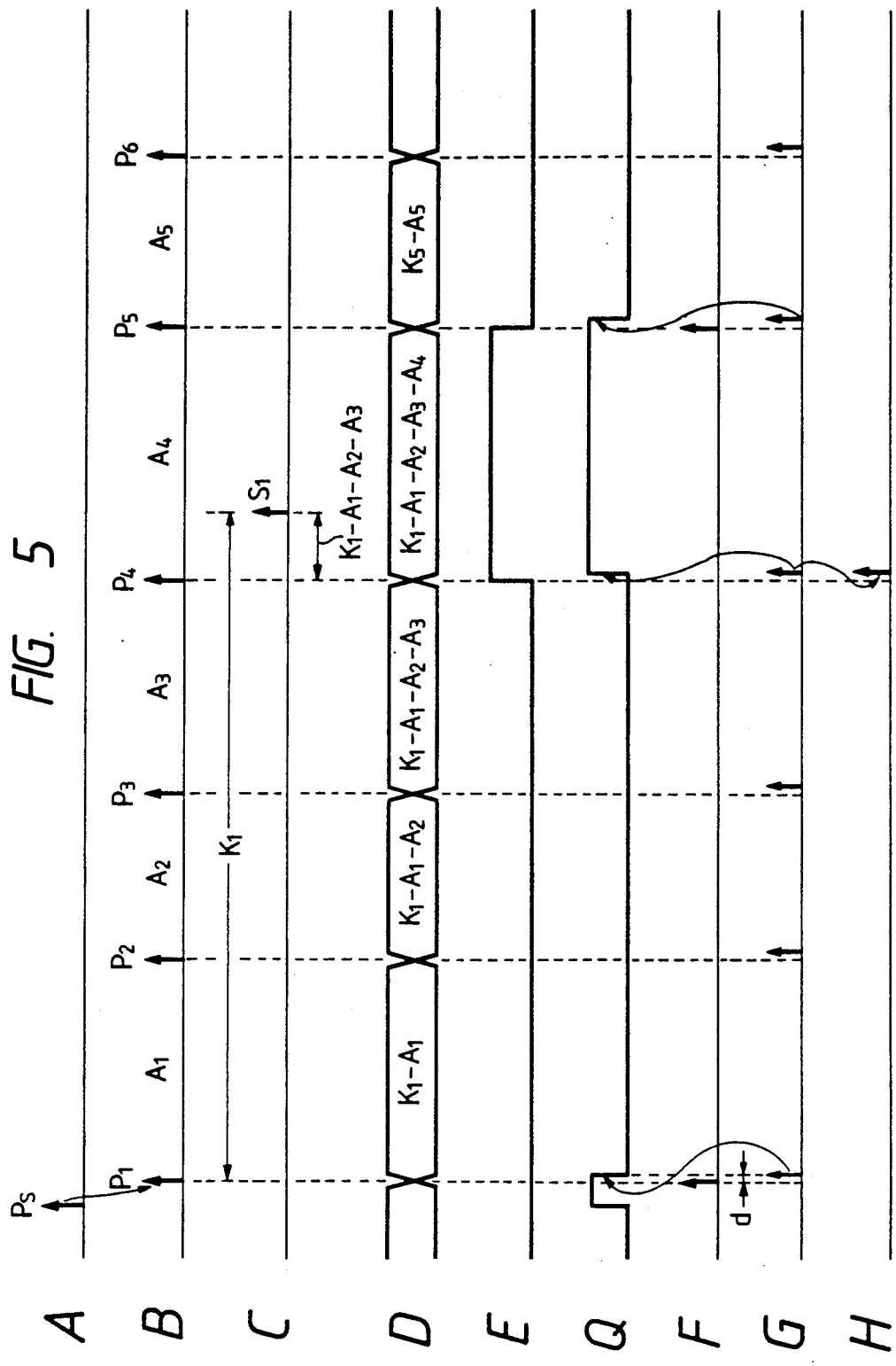
FIG. 5 is a timing chart for explaining the operation of the embodiment depicted in FIG. 4.

In the example described above with respect to FIG. 5 the value of the delay data $K_1$ is selected greater than three cycles of the timing pulse but smaller than four cycles, that is, intermediate between the pulses $P_4$ and $P_5$ in FIG. 5B. Accordingly, $K_1 - A_1 > 0$ and the sign output B of the subtractor 25A is "L", so that a gate 25D is held enabled but the gate 25E is held disabled. When the control signal F falls, the multiplexer 25B immediately connects its input terminal $D_2$ to the output Y, and consequently, the difference value $K_1 - A_1$ is applied to and latched in the latch circuit 25C by the delayed control signal G provided thereto via the gates 25D and 25E. In this instance, since the gate 25E remains disabled, the control signal G is not applied to the latch circuit 26A and the value $K_1 - A_1$ latched circuit 25C is not provided to the latch circuit 26A.

On the other hand, the pulse generator 24 yields, as shown in FIG. 5B, the timing pulse $P_2$ a time $A_1$ after the generation of the timing pulse $P_1$ in accordance with the period data $A_1$. The controller 23 responds to the pulse $P_2$ to provide the next addresses to the memories 21 and 22 to read out therefrom the data $K_2$ and $A_2$, respectively. In consequence, the subtractor 25A subtracts $A_2$ from the output $K_1 - A_1$ of the latch circuit 25C and outputs the difference. At this time, since the multiplexer 25B is not being supplied with the control signal F, its input terminal $D_2$ is connected to the output terminal Y and the subtracted output $(K_1 - A_1) - A_2$ of the subtractor 25A is provided via the multiplexer 25B to the latch circuit 25C. Since $(K_1 - A_1) - A_2 > 0$, the "L" output is provided to the sign output terminal B, and consequently, the gate 24D is open. The control signal G provided from the controller 23 in response to the pulse $P_2$ is applied via the gates 25D and 25F to the clock terminal CK of the latch circuit 25C to latch therein the value $(K_1 - A_1) - A_2$.

Also in response to the timing pulse $P_3$ the timing generator performs the same operations as those described above in connection with the timing pulse $P_2$, latching a cumulatively subtracted value $(K_1 - A_1 - A_2) - A_3$ in the latch circuit 25C. When the pulse generator 24 yields the timing pulse $P_4$, the period data $A_4$ is read out of the memory 21 in accordance with the address which is provided from the controller 23 in response to the timing pulse $P_4$ and the subtractor 25A performs a computation $(K_1 - A_1 - A_2 - A_3) - A_4$. Since the cumulatively subtracted output is minus in sign, an "H" signal is provided to the sign output terminal B, disabling the gate 25D and enabling the gate 25E.

Consequently, the control signal G is not applied to the latch circuit 25C, in which the previous value ($K_1-A_1-A_2-A_3$) is held intact. On the other hand, since the control signal G is provided via the gate 25E to the latch circuit 26A of the delayed pulse generator 26, the value ($K_1-A_1-A_2-A_3$) is latched in the latch circuit 26A, and at the same time, the counter 26B is reset to count the clock pulses CLK from zero upward. The comparator 26C compares the output of the latch circuit 26A and the output of the counter 26B and, upon detection of coincidence therebetween, yields a pulse. Accordingly, the delayed pulse generator 26 outputs, as a strobe pulse, a pulse delayed substantially for the time ($K_1-A_1-A_2-A_3$) relative to the timing pulse $P_4$.

Next, when supplied with the timing pulse $P_5$ from the pulse generator 24, the controller 23 yields the control signal F to read out data $K_5$ and $A_5$ from the memories 21 and 22, respectively. If $K_5-A_5>0$, then the output signal E at the sign output terminal B of the subtractor 25A goes low "L" as depicted in FIG. 5E, enabling the gate 25D and disabling the gate 25E. Thus the same operations as those mentioned above in connection with the data $K_1$ are conducted. If $K_5-A_5<0$, then the sign output signal E of the subtractor 25A remains high "H" during the period of the data $A_5$ and the control signal G provided in response to the timing pulse $P_5$ is applied as the latch signal H (not shown in FIG. 5H) to the delayed pulse generator 26 via the gate 25E and the delay element 25G. AS a result of this, the delay data $K_5$ latched in the latch circuit 25C by the control signal F provided in response to the timing pulse $P_5$ is input into the latch circuit 26A and the delayed pulse generator 26 generates a delayed strobe pulse (not shown in FIG. 5C) about the time $K_5$ after the generation of the timing pulse $P_5$.

As will be appreciated from the above, in the embodiment shown in FIG. 4, for example, when the strobe pulse $S_1$ is produced which is delayed for a time longer than one cycle relative to the generated timing pulse $P_1$, no strobe pulses will be produced corresponding to the timing pulses $P_2$, $P_3$ and $P_4$ which have been provided until the generation of the strobe pulse $S_1$, and after the generation of the timing pulse $P_5$, corresponding strobe pulses can be produced.

FIG. 6 illustrates another embodiment of the timing generator of the present invention which is capable of generating strobe pulses delayed as desired corresponding to all timing pulses produced. In this embodiment there are provided pairs of computing sections 25 and delayed pulse generators 26 of the same number as a predicted maximum number of delay cycles, five in this case. The computing sections 25a to 25e each include a latch circuit 25H, through which the delay data $K_1$, $K_2$, $K_3$, . . . read out of the memory 22 are provided to the input terminal $D_1$ of the multiplexer 25B. The computing sections 25a to 25e are almost identical in construction with the computing section 25 in FIG. 4 except the above.

The delay data read out of the memory 22 are provided to the latch circuits 25H of the computing section 25a through 25e in common to them, and latch signals Ja through Je for loading the data into the latch circuits 25a through 25e are provided from the controller 23 respectively corresponding to the timing pulses $P_1$, $P_2$, $P_3$, . . . from the pulse generator 24 as depicted in Figs. 7Ja to 7Je. By these latch signals Ja to Je the delay data are latched in the latch circuits 25H of the computing sections 25a to 25e in a cyclic order. On the other hand, the period data $A_1$, $A_2$, $A_3$, . . . read out of the memory 21 are provided to the computing sections 25a through 25e in common to them. The computing section 25a is supplied with control signals Ga produced in response to the first and subsequent timing pulses $P_1$, $P_2$, $P_3$, . . . after the generation of the start pulse Ps as shown in FIG. 7Ga, by which the outputs of the multiplexer 25B are sequentially latched in the latch circuit 25C. The computing section 25b is supplied with control signals Gb corresponding to the second and subsequent timing pulses $P_2$, $P_3$, $P_4$, . . . as shown in FIG. 7Gb, by which the outputs of the multiplexer 25B corresponding to the second and subsequent timing pulses $P_2$, $P_3$, . . . are latched in the latch circuit 25C. Similarly, the computing section 25c is supplied with control signals Gc corresponding to the timing pulses $P_3$, $P_4$, $P_5$, . . . as shown in FIG. 5Gc, by which the outputs of the multiplexer 25B corresponding to such timing pulses are latched in the latch circuit 25C. This applies to the computing sections 25d and 25e. The contents of the latch circuits 25C of the computing sections 25a to 25e are provided to the latch circuits 26A of the corresponding delayed pulse generators 26a to 26e and strobe pulses are produced on the basis of the values sequentially latched therein by the latch signals H in the same manner as in the embodiment depicted in FIG. 4.

The controller 23 includes, as shown in FIG. 8, an address counter 23A which counts timing pulses and generates an address, a quinary counter 23E for counting the timing pulses, a decoder 23F which decodes the count value of the quinary counter 23E and provides pulses to five output terminals in a sequential order, flip-flops 23G which respond to the outputs of the decoder 23F to cause their Q outputs to go high "H" in a cyclic order, gates 23H which are enabled by the Q outputs to pass therethrough the timing pulses, and an oscillator 23K which produces clock pulses CLK of a fixed period. The start pulse Ps is applied to reset terminals of the address counter 23A, the quinary counter 23E and the flip-flops 23G to reset them to their initial state.

The quinary counter 23E is a counter which is reset to zero upon each counting of five timing pulses and its count value is decoded by the decoder 23F, from which the control signals Ja to Je are provided one by one to five output terminals in a cyclic order as shown in FIGS. 7Ja to 7Je. These control signals are also used as control signals Fa to Fe, but in this case, since the timing for latching of the latch circuit 25H needs to precede the timing for latching of the latch circuit 25C at all times, the circuit pattern is designed so that the control signals Fa to Fe are slightly delayed behind the control signals Ja to Je. The outputs of the decoder 23F are also applied to the flip-flops 23G to make their Q outputs high "H" in a sequential order, enabling the gates 23H one after another. The timing pulses $P_1$, $P_2$, $P_3$, . . . are output, via the gates 23H, as the control signals Ga through Ge shown in FIGS. 7Ga to 7Ge.

With the arrangement depicted in FIG. 6, the computing sections 25a to 25e can provide a delay Of up to four cycles with respect to the timing pulse corresponding to the applied delay data. The operations of the computing sections 25a to 25e and the corresponding delayed pulse generators 26a to 26e are substantial same as those described previously in connection with the embodiment shown in FIG. 4, and hence no description will be given of their operations. The outputs of the delayed pulse generators 26a to 26e are output as the strobe pulses $S_1$, $S_2$, $S_3$, ... via an OR circuit 27.

As described above, the timing generator of the present invention employs an arrangement in which the delay data is cumulatively subtracted using the period data, it is determined, by the detection of inversion of the sign of the computed value, that the cycle in which to generate a delayed pulse has been reached, and the delayed pulse is generated at the time point elapsed after the beginning of the cycle by the value of the delay data obtained as the above-said cumulatively subtracted value, and consequently, it is possible to accurately produce delayed pulses even if the delay time is as long as several cycles of the period data. Accordingly, the timing generator of the present invention permits testing of a device which outputs a response signal several cycles after the application of a test pattern, such as a central processor. In addition, the timing generator does not utilize, for creating delayed pulses, a microcomputer which operates under program control, and hence it is capable of generating timing pulses of high throughput.

It will be apparent that many modifications and variations may be effected without departing from the scope of the novel concepts of the present invention.

What is claimed is:

1. A timing generator comprising:
   timing pulse generating means for receiving a start pulse and for generating timing pulses in response to receiving the start pulse;
   address generating means for generating addresses in response to the timing pulses;
   period data memory means for providing the period data in response to the addresses;
   delay data memory for providing a delay time relative to a corresponding timing pulse;
   commuting means for receiving the period data and the delay data and for cumulatively subtracting a period data from a corresponding delay data until a result of the subtraction changes sign; and
   strobe pulse generating means for receiving the result of the subtraction and in response to the sign of the result changing, loading thereinto the immediately preceding computed value as delay data and generates a pulse delayed behind the next timing pulse by the value of said loaded delay data.

2. The timing generator of claim 1, wherein said computing means includes:
   subtracting means for subtracting the period data from the corresponding delay data, and for outputting the result and a sign of the result;
   multiplexer means for receiving the result and the delay data and for selectively outputting one of these inputs;
   latch means for latching the output of said multiplexer means, and for providing the latched output to said subtracting means and to said strobe pulse generating means subtracting value, and wherein said generator further comprises:
   control means for receiving the timing pulses and for providing a selection signal to said multiplexer means so that said multiplexer means provide the delay data in response to a timing pulse received immediately after the start pulse, and the timing pulse immediately after the subtraction result changes sign and provides the result at other times.

3. The timing generator of claim 1, wherein said computing means and said strobe pulse generating means include a plurality of computing sections and a plurality of strobe pulse generators, respectively.

4. The timing generator of claim 3, wherein said generator further includes:
   control means includes means which responds to said timing pulse to generate a control signal for loading the delay data into said computing means in a sequential, cyclic order.

5. The timing generator of claim 4, wherein said computing means includes:
   first latch means which responds to said loading control signal to latch the delay data:
   subtracting means for receiving the period data at one input and data at another inputs, for subtracting the period data from the data received at the other input, and for outputting the result and its sign;
   multiplexer for receiving the result and the output of said first latch means and outputs either one of them in accordance with a selection control signal;
   and second latch means for latching the output of said multiplexer means and for providing the data latched by said second latch means as the data received at the other input of said subtracting means, and wherein said control means includes;
   selection control signal generating means for receiving the timing pulses and for providing the selection signal to said multiplexer means so that said multiplexer means provide the delay data in response to a timing pulse received immediately after the start pulse, and the timing pulse immediately after the subtraction result changes sign and provides the result at other times.

* * * * *

UNITED STATES PATENT AND TRADEMARK OFFICE
CERTIFICATE OF CORRECTION

PATENT NO. : 4,998,025
DATED : March 5, 1991
INVENTOR(S) : Naoyoshi Watanabe

It is certified that error appears in the above-identified patent and that said Letters Patent is hereby corrected as shown below:

Col. 7, line 35, after "providing" insert --data in response to the addresses, each delay data defining--;

line 37, change "commuting" to --computing--.

Signed and Sealed this

Eleventh Day of August, 1992

Attest:

DOUGLAS B. COMER

*Attesting Officer*  Acting Commissioner of Patents and Trademarks